(12) United States Patent
Chitnis

(10) Patent No.: US 10,873,002 B2
(45) Date of Patent: Dec. 22, 2020

(54) PERMANENT WAFER BONDING USING METAL ALLOY PREFORM DISCS

(75) Inventor: Ashay Chitnis, Goleta, CA (US)

(73) Assignee: Cree, Inc., Goleta, CA (US)

(*) Notice: Subject to any disclaimer, the term of this patent is extended or adjusted under 35 U.S.C. 154(b) by 298 days.

(21) Appl. No.: 11/584,135

(22) Filed: Oct. 20, 2006

(65) Prior Publication Data
US 2008/0096365 A1 Apr. 24, 2008

(51) Int. Cl.
- *H01L 23/48* (2006.01)
- *H01L 33/38* (2010.01)
- *H01L 33/00* (2010.01)
- *H01L 33/64* (2010.01)

(52) U.S. Cl.
CPC ........ *H01L 33/0093* (2020.05); *H01L 23/481* (2013.01); *H01L 33/382* (2013.01); *H01L 33/64* (2013.01)

(58) Field of Classification Search
CPC . H01L 33/382; H01L 23/481; H01L 33/0093; H01L 2924/0002; H01L 33/64; H01L 33/647; H01L 2924/3011
See application file for complete search history.

(56) References Cited

U.S. PATENT DOCUMENTS

| | | | |
|---|---|---|---|
| 4,889,832 A | 12/1989 | Chatterjee | 438/270 |
| 4,946,547 A | 8/1990 | Palmour et al. | 156/643 |
| 5,200,022 A | 4/1993 | Kong et al. | 156/612 |
| RE34,861 E | 2/1995 | Davis et al. | 437/100 |
| 6,087,244 A | 7/2000 | Jeon | 438/426 |
| H1934 H * | 1/2001 | Dautartas | 148/430 |
| 6,205,264 B1 * | 3/2001 | Jin | B23K 35/0233 385/14 |
| 6,236,103 B1 | 5/2001 | Bernstein et al. | 257/532 |
| 6,434,946 B1 * | 8/2002 | Shaw | B23K 35/3046 228/227 |
| 6,521,923 B1 | 2/2003 | D'Anna et al. | 257/288 |
| 6,860,652 B2 * | 3/2005 | Narayan | G02B 6/4201 257/E25.032 |
| 6,888,167 B2 | 5/2005 | Slater, Jr. et al. | 257/81 |
| 7,109,583 B2 * | 9/2006 | Johnson | H01L 23/49811 257/734 |
| 7,132,746 B2 * | 11/2006 | Brandenburg et al. | 257/713 |
| 7,223,629 B2 * | 5/2007 | Zheng | H01L 31/0203 257/E21.499 |

(Continued)

OTHER PUBLICATIONS

John J. Callahan et al., "Thin Film Au-Su Bonding for Optoelectronic Integration," Proc. SPIE (1998) vol. 3289, pp. 68-73.

(Continued)

*Primary Examiner* — Savitri Mulpuri
(74) *Attorney, Agent, or Firm* — Ferguson Case Orr Paterson LLP

(57) ABSTRACT

A method for fabricating semiconductor devices at the wafer level, and devices fabricated using the method, are described. Wafer-level bonding using a relatively thick layer of electrically conducting bond medium was used to achieve void-free permanent wafer level bonding. The bond medium can be introduced to the pre-bonded wafers by deposition or as a preform. The invention provides a low cost, simple and reliable wafer bonding technology which can be used in a variety of device fabrication processes, including flip chip packaging.

15 Claims, 3 Drawing Sheets

(56) References Cited

U.S. PATENT DOCUMENTS

| | | | | |
|---|---|---|---|---|
| 7,255,494 | B2* | 8/2007 | Zheng | G02B 6/4201 |
| | | | | 257/E25.032 |
| 7,271,491 | B1 | 9/2007 | Akram | 257/774 |
| 7,329,905 | B2 | 2/2008 | Ibbetson et al. | 257/98 |
| 7,416,962 | B2* | 8/2008 | Harrison et al. | 438/459 |
| 7,513,035 | B2* | 4/2009 | Too et al. | 29/832 |
| 7,824,937 | B2* | 11/2010 | Suehiro | H01L 33/56 |
| | | | | 257/E21.504 |
| 7,851,348 | B2* | 12/2010 | Misra et al. | 438/618 |
| 8,390,126 | B2* | 3/2013 | Goudarzi | H05K 3/3436 |
| | | | | 257/772 |
| 2003/0080408 | A1 | 5/2003 | Farnworth et al. | 257/698 |
| 2003/0151051 | A1 | 8/2003 | Johnson et al. | 257/77 |
| 2003/0160256 | A1 | 8/2003 | Durocher et al. | 257/88 |
| 2004/0130002 | A1 | 7/2004 | Weeks et al. | 257/622 |
| 2004/0217360 | A1 | 11/2004 | Negley | 257/79 |
| 2005/0106408 | A1* | 5/2005 | Chen et al. | 428/629 |
| 2006/0006404 | A1 | 1/2006 | Ibbetson | |
| 2006/0138436 | A1 | 6/2006 | Chen et al. | 257/98 |
| 2006/0163596 | A1 | 7/2006 | Kim et al. | 257/98 |
| 2006/0189098 | A1 | 8/2006 | Edmond | |
| 2006/0237735 | A1* | 10/2006 | Naulin et al. | 257/98 |
| 2007/0012970 | A1 | 1/2007 | Mouli | 257/292 |
| 2007/0284602 | A1* | 12/2007 | Chitnis et al. | 257/98 |
| 2008/0096365 | A1 | 4/2008 | Chitnis | |
| 2008/0283960 | A1 | 11/2008 | Lerner | |
| 2009/0065790 | A1* | 3/2009 | Chitnis | H01L 33/44 |
| | | | | 257/88 |

OTHER PUBLICATIONS

Z. S. Luo et al., "Enhancement of (In,Ga)N Light-Emitting Diode Performance by Laser Liftoff and Transfer From Sapphire to Silicon," IEEE Photonics Technology Letters (Oct. 2002), vol. 14, No. 10.
Office Action from U.S. Appl. No. 11/732,559, dated Mar. 4, 2010.
Response to Office Action from U.S. Appl. No. 11/732,559, filed Jun. 25, 2010.
Office Action from U.S. Appl. No. 11/732,559, dated Mar. 1, 2011.
Response to Office Action from U.S. Appl. No. 11/732,559, filed May 27, 2011.
Office Action from U.S. Appl. No. 11/732,559, dated Aug. 17, 2011.
Response to Office Action from U.S. Appl. No. 11/732,559, filed Oct. 10, 2011.
Office Action from U.S. Appl. No. 11/732,559, dated Oct. 20, 2011.
"Accuratus in Aluminum Nitride, AlN Material Characteristics: Aluminum Nitride Engineering Properties", 2002, accessed online on Aug. 12, 2011 at http://accuratus.com/alumni.html.
Office Action from U.S. Appl. No. 11/732,559, dated Mar. 5, 2013.
Response to OA from U.S. Appl. No. 11/732,559, filed May 29, 2013.
Office Action from U.S. Appl. No. 11/732,559, dated Sep. 10, 2013.
Office Action from U.S. Appl. No. 11/732,559, dated Sep. 3, 2014.
Office Action from U.S. Appl. No. 11/732,559, dated Apr. 2, 2014.
Office Action from U.S. Appl. No. 11/732,559; dated Nov. 19, 2015.
Office Action from U.S. Appl. No. 11/732,559, dated Apr. 1, 2015.
Office Action from U.S. Appl. No. 11/732,559, dated Nov. 19, 2014.

* cited by examiner

PERMANENT WAFER BONDING USING METAL ALLOY PREFORM DISCS

BACKGROUND OF THE INVENTION

Field of the Invention

The present invention relates to semiconductor devices, and more particularly to light emitting devices and methods of fabricating light emitting devices.

Description of Related Art

Light emitting diodes and laser diodes are well known solid state electronic devices capable of generating light upon application of a sufficient voltage. Light emitting diodes and laser diodes may be generally referred to as light emitting devices (LEDs). Light emitting devices generally include a p-n junction formed in an epitaxial (epi) layer such as gallium nitride (GaN) grown on a substrate such as sapphire ($Al_2O_3$), silicon (Si), silicon carbide (SiC), gallium arsenide (GaAs) and the like. The wavelength distribution of the light generated by the LED depends on the material from which the p-n junction is fabricated and the structure of the thin epitaxial layers that include the active region of the device. Commercial high-efficiency LEDs are typically fabricated from two classes of III-V semiconductor materials. Group-III nitride (III-N) based materials are used for the color range from ultraviolet to blue-green, and Group-III arsenide-phosphide (III-AsP) for yellow to near-infrared.

There has been a great deal of recent interest in LEDs formed of Group-III nitride based material systems because of their unique combination of material characteristics including high breakdown fields, wide bandgaps (3.36 eV for gallium nitride (GaN) at room temperature), large conduction band offset, and high saturated electron drift velocity. The doped and active layers are typically formed on a substrate that can be made of different materials such as silicon (Si), silicon carbide (SiC), and sapphire ($Al_2O_3$). SiC wafers are often preferred for these types of heterostructures because they have a much closer crystal lattice match to Group-III nitrides, which results in Group III nitride films of higher quality. SiC also has a very high thermal conductivity so that the total output power of Group III nitride devices on SiC is not limited by the thermal resistance of the wafer (as is the case with some devices formed on sapphire or Si). Also, the availability of semi-insulating SiC wafers provides the capacity for device isolation and reduced parasitic capacitance that make commercial devices possible.

Flip chip microelectronic assembly is the direct electrical connection of face-down (hence, "flipped") electronic components onto substrates, circuit boards, carriers or the like by means of conductive bumps on the chip bond pads. Flip chip is also called Direct Chip Attach (DCA), a more descriptive term since the chip is directly attached to the substrate, board, or carrier by the conductive bumps. In contrast, wire bonding, the technology which flip chip is replacing, uses face-up chips with a wire connection to each pad.

Flip chip components are predominantly found in semiconductor devices, but other components such as passive filters, detector arrays, and MEMs devices are also beginning to be fabricated and used in flip chip form. The recent boom in flip chip packaging results both from flip chip's advantages in size, performance, flexibility, reliability, and cost over other packaging methods, and from the widening availability of flip chip materials, equipment, and services. In particular, adequate thermal management can be achieved through flip-chip bonding of the device onto a thermally conductive, electrically insulating substrate.

LEDs can be fabricated on a substrate, such as a SiC wafer, and then flip-chip mounted onto a submount, such as a Si carrier wafer, in which case the substrate becomes the primary emitting surface of the LED. However, light coupled into the SiC substrate can get trapped within the substrate by total internal reflection (TIR), which reduces the overall emission efficiency of the device. Substrate removal is one of several approaches known to improve light extraction, and therefore offers to be a promising choice to fabricate solid-state light emitting devices. To realize this in practice, a substrate wafer containing multiple semiconductor light emitting devices can be flip-chip mounted on a carrier wafer. The substrate can then be removed from the emitting devices, followed by necessary wafer fabrication and finally device separation. This requires flip-chip bonding at the wafer level (i.e. wafer-level bonding), and thus differs from conventional flip chip mounting in which substrate modification, if any, takes place on individual devices that were separated prior to being flip-chip mounted onto a submount (device-level bonding). Wafer-level bonding is typically employed to form larger, more complex devices.

Wafer-level bonding consists of joining wafers either directly or via an intermediate bonding layer, thus facilitating permanent or temporary integration of materials during semiconductor fabrication. Direct bonding involves only the wafer materials to be joined. Wafer-level bonding involves an intermediate bonding layer which may include materials such as evaporated glass, polymers, spin-on glasses, photo resist, polyamide, and solder as the bond medium. The choice of bond technology depends upon the application, as each of these processes have specific attributes such as process temperature, mechanical strength, and process robustness. An application that requires the bond medium to be electrically and thermally conducting, for example, limits the choice of a bond intermediate layer or the bond medium to solder materials or electrically and thermally conducting epoxies and polyamides. Epoxies and polyamides have low glass transition temperature, thus limiting post processing and packaging temperature. Stress effects due to high CTE (coefficient of thermal expansion) and degassing are other disadvantages of using epoxies or polyamides as the bond layer.

Eutectic wafer-level bonding is based on use of bonding materials that form alloys at specific temperatures and conditions. A eutectic wafer-bonding process using solder as the bond medium, for example, typically works by reflowing low melting temperature metal or metal alloy to form a seal. Solder material reflows or melts at or near or above the eutectic temperature, and solidifies upon cooling below the eutectic temperature, of the solder material being used.

Substrate-free III-Nitride flip-chip LEDs can be fabricated by permanent wafer-level bonding of device wafers onto copper (Cu) or silicon (Si) submount wafers using a eutectic solder scheme. One significant disadvantage of this approach is that it relies heavily on the formation of a thin layer of eutectic material during the bond process, which holds the two materials upon cooling. This results in stringent requirements on the shape and thermal properties of the wafers to be bonded. In particular, the use of a thin bond film requires the wafers to be extremely flat, necessitating that the wafers have low total thickness variation (TTV). Semiconductor wafers typically have a thickness of about 0.2-1 mm and a diameter from about 25-300 mm and, although generally smooth, possess a wide range of dimensional imperfections, including surface imperfections and flatness deviations. Wafers can, for example, have hundreds of nanometers of flatness variation and surface waviness over a millimeter scale, as well as wafer scale shape variation across the diameter (bow and warp). A thin bond medium can therefore leave gaps or voids at the bond interface as the result of wafer and surface imperfections and non-uniformities. In particular, a thin bond film requires the wafers to be extremely flat and to have a low total thickness variation (TTV), which is very expensive to produce. Another major disadvantage of using a thin metal film as the bond medium is the requirement of high bond pressures to ensure elastic deformation of the wafers for conformal void-free bonding. High bond pressures produce excess residual stress in the system which can result in defects.

Device-level bonding using a thin film of bond medium provides mechanical, thermal and, in the case of flip-chip mounted structures, also electrical connection between the die and the submount wafer. Once the bond medium hardens, all the assembly components are coupled, including the bond medium. However, if the coefficient of thermal expansion (CTE) and/or temperature of the materials or components involved are different, then thermal mismatch causes stresses during the bond cycle that can result in die fracture or interface failure. For bonding larger die (e.g. tens of millimeters in diameter), or in wafer-level bonding, fracture effects can be even more severe as a result of elevated stresses both in the die and the bonding material. The use of a thin bond film thus essentially requires the wafers to have a low CTE mismatch to accommodate the stress as a result of the bond cycle and, as a result, is generally limited to situations in which the materials or components being bonded are composed of the same or very similar materials, or when stress effects are minimized by wafer bonding at lower temperatures. Therefore, along with the stringent requirements on wafer shape discussed earlier, CTE mismatch severely narrows the scope of wafer material selection for thin film bonding and thus is not a practical or commercially viable approach for many types of applications.

Simple theoretical calculations with solder as the bond medium shows that solder can help accommodate stress during the bonding cycle, particularly the stress resulting from CTE mismatch of the wafers. However, as wafer size increases, there are practical limitations to the thickness of solder bonding materials achievable using thin film deposition techniques such as electron beam (e-beam) deposition or sputtering, including cost.

Solder preforms are manufactured shapes of solder or braze metals which are generally designed to fit a specific joint configuration. They contain precise and predetermined quantities of an alloy or a pure metal and are used in a variety of applications, including hybrid and discrete component assembly and surface mount technology. Solder preforms are available in a variety of shapes and sizes, a large number of alloy types and purities, and a wide range of melting temperatures. Ribbon is also available for users to produce their own preforms.

SUMMARY OF THE INVENTION

Briefly, and in general terms, the present invention is directed to void-free, wafer-level bonding processes and devices fabricated using such processes.

In particular, the present invention uses a relatively thick layer of electroconducting bond medium to achieve permanent wafer-level bonding. The bond medium can be introduced to the pre-bonded wafers by deposition or as a preform. Wafer-level bonding using a relatively thick layer of bond medium provides a number of advantages, as fully described below. In particular, it minimizes stress effects due to CTE mismatch of the wafers during the bonding cycle and compensates for dimensional imperfections in the wafer, providing a practical or cost-effective approach to forming void-free bond pairs.

In one of several aspects, the invention relates to a method of fabricating a light emitting device (LED) that includes a wafer-level bonding process in which a relatively thick layer of electroconducting bond medium is used for bonding. In another aspect, the bond medium is electroconducting and thermoconducting. In yet another aspect, the bond medium contains metal. In a further aspect, the bond medium is provided as a preform.

In another aspect, the invention relates to a method of fabricating a light emitting device in which, after wafer-level bonding, a substrate on one of the bonded wafers is removed.

In a further aspect, the invention relates to a light emitting device fabricated by a process which includes wafer-level bonding using a relatively thick layer of electroconducting bond medium. In another aspect, the light emitting device is a light emitting diode. In yet another aspect, the light emitting device is a flip chip device.

These and other aspects and advantages of the invention will become apparent from the following detailed description and the accompanying drawings which illustrate by way of example the features of the invention.

DETAILED DESCRIPTION OF THE INVENTION

Figure 1:
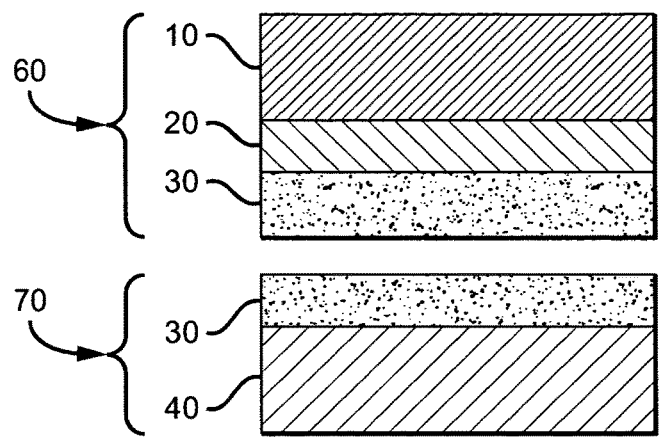
FIG. 1 is a schematic cross sectional view of one embodiment of the invention showing an LED device wafer having a layer of bond medium and a submount wafer having a layer of bond medium.

The present invention provides improved fabrication for light emitting devices (LEDs) through the use of wafer-level bonding processes which minimize stress effects during bonding and compensate for dimensional imperfections in the wafers. In particular, the invention uses a relatively thick layer of bond medium to achieve permanent wafer level bonding while minimizing stress effects due to CTE mismatch of the wafers during the bonding cycle. The bond medium can be introduced to a pre-bonded wafer as a preform or by various deposition techniques.

There are several important advantages provided by the present invention, including without limitation those described below for embodiments using a preform:

1. Low cost—Vacuum deposition is an expensive technique for obtaining solder films with thicknesses greater than few microns. Preforms are much more cost effective when bond film thickness of few microns or greater is required.

2. Low force—Successful wafer-level bonding at an order of magnitude lower bond force as compared to thin film (e.g. less than about 4 microns thick) can be achieved using preform based bonding. Low bond force is also important in that it avoids damage to underlying fragile layers, such as Ag mirrors, during the bond cycle.

3. Flexibility—Wafers with dimensional imperfections such as larger total thickness variation (TTV), bow, and/or warp can be bonded by selecting an appropriate thickness of the bond medium and hence the preform. This allows the possibility of pre-patterning the surface of one or both of the wafers being bonded (e.g. to improve light extraction). In addition, various alloy preforms may be selected for low or high temperature wafer-level bonding based on specific requirements.

4. Scalability—Because the bonding force for 2" wafer can be relatively low with thick preforms, it should be easier to scale this approach for 3" and larger wafers. Other options such as the use of a thicker submount wafer for 3" wafers and preforms of different alloys can also be utilized.

5. Manufacturability—Preforms are high volume manufacturing compatible. In addition, stack bonding (simultaneously bonding additional wafer pairs arranged in a stack) to boost process yield has been successfully demonstrated.

Other features and advantages of the invention will be apparent from the following detailed description when taken together with the drawings, and from the claims. The following description presents preferred embodiments of the invention representing the best mode contemplated for practicing the invention. This description is not to be taken in a limiting sense but is made merely for the purpose of describing the general principles of the invention whose scope is defined by the appended claims.

Before addressing details of embodiments described below, some terms are defined or clarified. As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The following definitions refer to the particular embodiments described herein and are not to be taken as limiting; the invention includes equivalents for other undescribed embodiments.

As used herein, the term "adjacent to" when referring to a layer or coating on a particular surface does not necessarily mean that the layer or coating is immediately next to the surface. There may or may not be another contiguous or non-contiguous layer, coating, or material present between the layer or coating described and the surface, and the surface itself can be another layer or coating.

As used herein, the term "between" when referring to a layer or preform having bond medium placed in an intermediate space or interval between two surfaces, does not necessarily mean that the layer or preform is immediately next to one or both surfaces. There may or may not be another contiguous or non-contiguous layer, coating, component, or other material present between the layer or preform and one or both surfaces.

As used herein, the term "bond pair" when referring to wafer bonded structures is intended to mean a structure containing two wafers bonded together. The wafers may be joined directly or via an intermediate layer of bond medium, and bond can be permanent or temporary.

As used herein, the term "chip" is intended to mean a single piece of semiconductor wafer containing an entire integrated circuit which has not yet been packaged; equivalent terms—die, integrated circuit (IC).

As used herein, the term "depositing" or "deposition" when referring to depositing materials on a surface is intended to mean any viable or practical method of deposition or application including without limitation electroplating, vapor deposition, evaporation, sputtering, layering, sprinkling, beading, extruding, printing, patterning, or spraying.

As used herein, the term "device bonding" or "device-level bonding" is intended to mean a process in which individual die on a wafer are physically separated prior to bonding the die to another wafer. One nonlimiting example of device-level bonding is flip-chip bonding of singulated devices to a carrier wafer.

As used herein, the term "device wafer" is intended to mean a wafer populated with multiple chips. A Si wafer supporting multiple LEDs, prior to singulation (i.e. LED wafer), is a non-limiting example of a device wafer.

As used herein, the term "die" is intended to mean single piece of semiconductor wafer containing an entire integrated circuit which has not yet been packaged; equivalent terms—chip, integrated circuit (IC).

As used herein, the term "epi" or "epitaxial" when referring to a substrate, wafer, layer, or surface is intended to mean a substrate, wafer, layer, or surface having an orientation that allows epitaxial deposition.

As used herein, the term "eutectic bond" or "eutectic bonding" when referring to wafer-level bonding is intended to mean a bond formed by heating two or more materials in a joint such that they diffuse together to form an alloy composition that melts at a lower temperature than the base materials.

As used herein, the term "flip chip" when referring to a device is intended to mean a device made using flip chip microelectronic assembly, including without limitation the direct electrical connection of face-down ("flipped") electronic components onto substrates, circuit boards, carriers or the like by means of conductive bumps on the chip bond pads; equivalent terms—Direct Chip Attach (DCA).

As used herein, the term "layer" or "coating" is intended to mean one thickness, course, or fold laid or lying over or under another layer or support. The layer may be contiguous or non-contiguous (e.g. patterned, beaded or sprinkled).

As used herein, the term "preform" when referring to wafer bonding media is intended to mean bonding material molded into predetermined shapes, volumes, or dimensions, including without limitation a solder preform.

As used herein, the term "submount" or "submount wafer" is intended to mean a support layer in a packaged device. Non-limiting examples of submount wafers include substrates, circuit boards, MEMS, and carrier wafers. Submount wafers are generally found in flip chip packaged devices, where they may have one or more functions including without limitation providing support for, or connecting the electronic components of, a device wafer.

As used herein, the "substrate" or "substrate wafer" is intended to mean a base or support to which additional layers, components, or other materials are applied. A substrate can, for example, provide the basis for subsequent processing operations in the fabrication of semiconductor devices or circuits, including without limitation chips and multichip modules (MCM). Additional device layers, components or other materials applied to a substrate include without limitation epitaxial materials or layers, printed circuit boards, and disk platters. A small, thin circular slice of a semiconducting material such as pure silicon, on which an integrated circuit or flip chip can be formed, is one non-limiting example of a substrate; equivalent terms—growth wafer.

As used herein, the term "wafer" is intended to mean a thin slice of semiconductor material used in manufacturing semiconductor devices and integrated circuits.

As used herein, the term "wafer bonding" or "wafer-level bonding" is intended to mean a process in which individual die on a substrate wafer are not physically separated prior to bonding. Wafer-level bonding techniques include without limitation anodic (electrostatic) bonding, fusion bonding, adhesive bonding, eutectic bonding, solder bonding, thermocompression, and glass frit bonding.

Attention is now directed to more specific details of embodiments that illustrate but not limit the invention.

The present invention uses a relatively thick layer of electroconducting bond medium to achieve permanent wafer-level bonding while minimizing stress effects due to CTE mismatch of the wafers during the bonding cycle and compensating for dimensional imperfections in the wafers being bonded. The bond medium can be introduced to the pre-bonded wafers by deposition or as a preform. This process can facilitate flip chip packaging in some types of devices.

In one of several embodiments, the invention relates to a method of fabricating a light emitting device (LED) that includes a wafer-level bonding process in which a relatively thick layer of electroconducting (electrically conducting) bond medium is used for bonding. In certain embodiments, a preform containing bond medium can provide a single layer of relatively thick bonding material. In other embodiments, bond medium may be deposited on one or both wafers, forming a relatively thick layer of bonding medium when the wafers are subsequently aligned prior to bonding.

Figure 2:
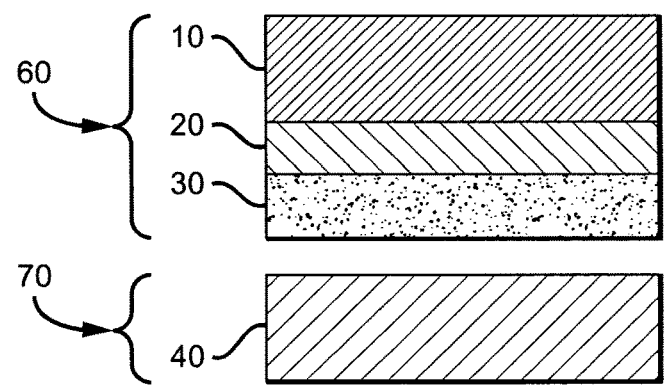
FIG. 2 is a schematic cross sectional view of one embodiment of the invention showing an LED device wafer having a layer of bond medium.
Figure 3:
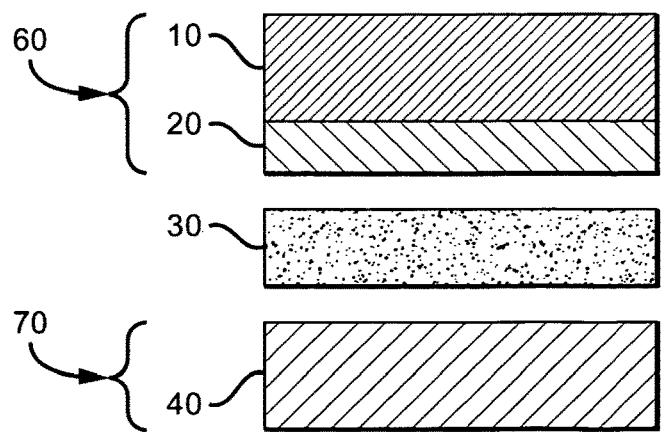
FIG. 3 is a schematic cross sectional view of one embodiment of the invention showing an LED device wafer, a bond medium preform, and a submount wafer.

FIGS. 1-3 are schematic cross sectional views of several embodiments of the invention. For simplicity and ease of interpretation, the individual devices on the device wafers depicted in these Figures are not delineated. FIG. 1 is a schematic cross sectional view of one embodiment of the invention where the bond medium has been deposited on two wafers prior to bonding. The wafers shown in this embodiment are an LED device wafer (60) and a submount wafer (70). The device wafer contains an epitaxial (epi) substrate (10), an epi layer (20), and a layer of bond medium (30). The submount wafer contains a layer of bond medium (30) and a submount wafer (40). The total thickness of the bond medium should be greater than about 4 microns, preferably from about 4 to about 50 microns. The total thickness of the bond medium may be deposited on one or both wafers, either evenly or unevenly. In one embodiment, for example, about a 1 micron thickness of bond medium can be deposited on one wafer and about a three micron thickness deposited on the other wafer, resulting in a total bond medium thickness of about 4 microns. In another embodiment, all of the bond medium may be deposited on only one wafer. Preferably, the thickness of the bond medium deposited on each wafer is from about 2 to about 3 microns. In some embodiments, the thickness of the bond medium on each wafer may approximate the thickness of the wafers.

FIG. 2 is a schematic cross sectional view of one embodiment of the invention where the bond medium has been deposited on only one of the two pre-bonded wafers. The wafers shown in this embodiment are an LED device wafer (60) and a submount wafer (70), and in this embodiment, the bond medium (30) has been deposited only on the device wafer (60). Alternatively, in another embodiment, the bond medium may be deposited only on the submount wafer (40). The total thickness of the bond medium in this embodiment is preferably from about 4 to about 20 microns.

FIG. 3 is a schematic cross sectional view of one embodiment of the invention showing an LED device wafer (60), a bond medium preform (30), and a submount wafer (70). The preform can be manufactured to the approximate size of the wafers being bonded or customized to the required shape and size using, for example, preform ribbon.

Figure 4A:
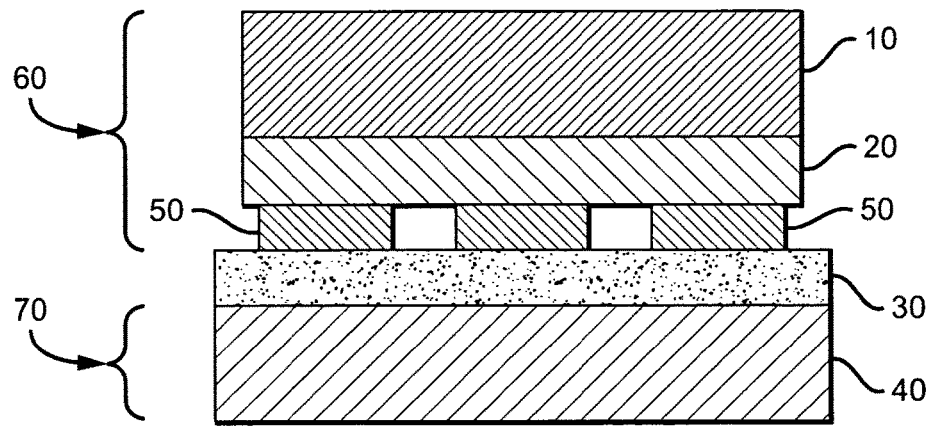
FIG. 4A is a schematic cross sectional view of one embodiment of the invention showing an LED device wafer bonded to a submount wafer at the wafer level.
Figure 4B:
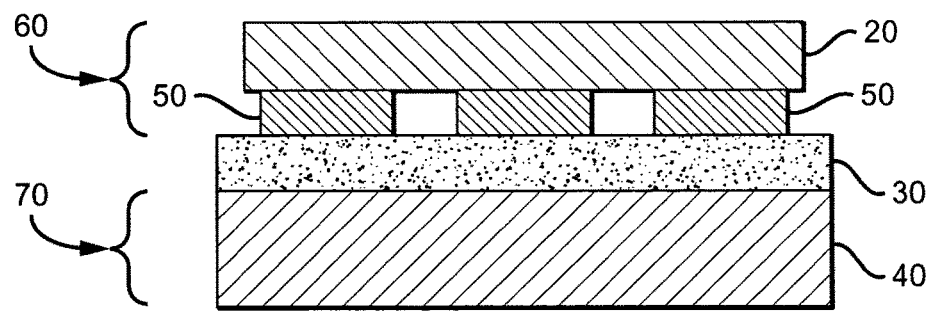
FIG. 4B is a schematic cross sectional view of the embodiment shown in FIG. 4A after the substrate used to fabricate the device has been removed.
Figure 4C:
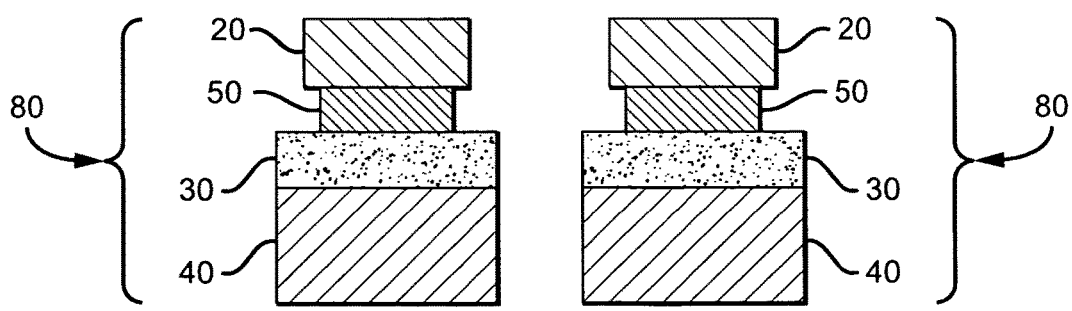
FIG. 4C is a schematic cross sectional view of the embodiment shown in FIG. 4B after singulation of the bonded wafers.

Bonding the wafers prior to singulation presents several advantages including, without limitation, minimizing bond stress effects leading to defective devices and removing the necessity of aligning and bonding a multitude of singulated chips. As shown in FIGS. 4A-C for one embodiment of the invention, a flip chip LED, removal of an LED wafer substrate (10) from a wafer-level bonded LED wafer (60) prior to singulation can be a much simpler (i.e. one step) process than removing multiple LED wafer substrates (10) from individual chips (80) following singulation. FIG. 4A is a schematic cross sectional view showing an LED (device) wafer (60) having metal contacts pads (50) bonded to a submount wafer (70) at the wafer level. FIG. 4B is a schematic cross sectional view of the wafer bonded embodiment shown in FIG. 4A after removal of the LED wafer substrate (10). Removal of the minimally absorptive LED wafer substrate (10) in flip chip LEDs provides enhanced device efficiency, and provides an exposed epi/LED surface for texturing or other treatments than can further increase the optical output of the device. FIG. 4C is a schematic cross sectional view of the wafer bonded embodiment shown in FIG. 4B after singulation.

The present invention can be used to fabricate a variety of devices, including without limitation photoelectronic, electronic, and semiconductor devices. Wafers suitable for use in the present invention can be composed of a variety of materials depending on device type or application, including without limitation: sapphire, GaAs, GaP, AlN, and GaN, or Si and SiC for device wafers, or Si and SiC for submount wafers. Other materials suitable for substrate wafers include without limitation Cu, Ag, and Ni. The thickness of a typical device wafer or substrate wafer suitable for use in the present invention is from about 100 microns to about 1.5 mm, while the thickness of a suitable preform can be greater than about 4 microns, preferably from about 4 microns to about 100 microns and, even more preferably, from about 4 microns to about 50 microns. In embodiments employing metal foil as a bond medium, the thickness of the preform is preferably greater than about 8 microns (to provide for efficient and practical handling of the foil). In order to facilitate microelectronic integration, a substrate wafer according to the invention can contain fabricated devices prior to wafer-level bonding, or integrated devices or circuits may be fabricated onto a submount wafer or device wafer after bonding. Similarly, microelectronic integration according to the invention may include circuits fabricated on a submount wafer (e.g. for substrate-free device) or on a device wafer (if not removed), or both.

The bond medium can be chosen from a variety of materials depending on the type of wafers used, including without limitation eutectic materials, a metal with good thermal compression, and an adhesive comprising metal. Preferably, the bond medium is electroconducting and, more preferably, the bond medium is electroconducting and thermoconducting (thermally conducting). Typical solder materials useful as bond media for the present invention include without limitation Au—Sn, Pb—Sn, Au—Si, and Ag—Sn—Cu. Preforms are commercially available in a variety of different materials including without limitation In, PdIn, PbSn, AgSn, AuSn, and AuSi. Alternatively, bond medium can be deposited using any suitable deposition technology including without limitation electroplating, vapor deposition, evaporation, sputtering, layering, sprinkling, beading, extruding, patterning, or spraying. The method of wafer-level bonding can vary depending on the materials used, such as the use of a reflow process for eutectic wafer-level bonding.

EXAMPLES

Example 1

2" diameter LED wafers (with SiC substrates) having TTV up to 7 microns and thicknesses of approximately 250 microns (0.25 mm) were successfully bonded onto submount (Si) wafers with TTV up to 7 microns using eutectic Au/Sn (80/20) preforms having 1.38" to 2" diameters and thicknesses of 0.5 mil to 1 mil (12.7 microns to 25.4 microns). The preform was sandwiched between an LED wafer and a submount wafer and the wafer pair was then placed on the bond tool/chuck with either the LED wafer or the submount wafer in contact with the bond tool/chuck using manual alignment. Bonding was performed at or above the preform eutectic temperature and in vacuum to obtain uniform, void-free bonding over the whole 2" wafer. Typical vacuum reflow conditions used for wafer bonding were: temperature, 320° C. to 350° C.; reflow time, 30 seconds to 60 seconds, and a controlled cool down. The thickness of the bonded wafer pair (bond pair), including the thickness of each of the bonded wafers the thickness of a layer of bond medium, ranged from about 5 to about 12 microns.

The device wafer substrate was then thinned to about 10 to about 50 microns using standard wafer slicing or grinding techniques. Au/Sn performs are available from Indium Corp. of Utica, N.Y.

Figure 5:
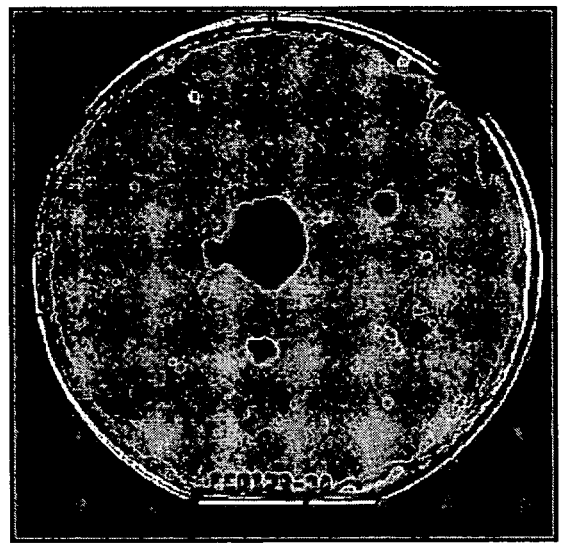
FIG. 5 is a scanning acoustic microscopy (SAM) image of a plan view of one embodiment of the invention showing a device wafer bonded to a submount wafer using a thin layer of bond medium.
Figure 6:
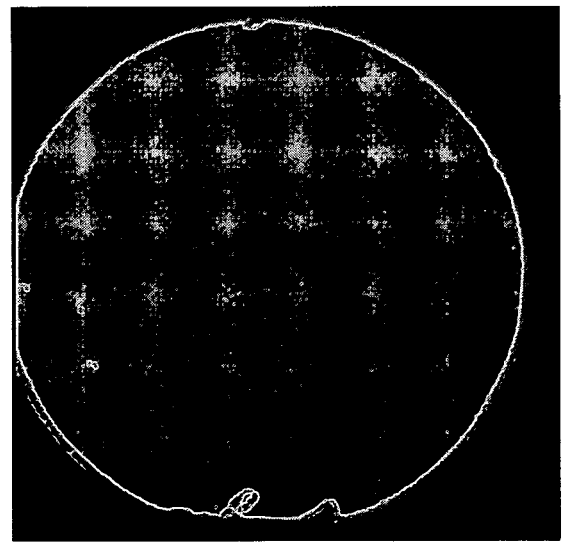
FIG. 6 is a scanning acoustic microscopy (SAM) image of a plan view of one embodiment of the invention showing a device wafer bonded to a submount wafer using a relatively thick solder preform.

FIGS. 5-6 show Scanning Acoustic Microscopy (SAM) images of 2" wafers bonded with thin and thick layers of bonding media, respectively. FIG. 5 shows the results of bonding an SiC wafer containing fabricated LEDs (device wafer) to a Si carrier wafer (submount wafer) using thin layer of AuSn (less than about 4 microns) as the bond medium. The large, dark regions in the Figure are large voids in the bond. FIG. 6 shows the same type of device and submount wafers bonded using a solder preform of the type described in Example 1. The post-bond thickness of the bond pair was about 10 microns. The lack of large dark regions in this image shows that void-free bonding can be achieved using a thicker bonding medium. FIGS. 5-6 were obtained using a SAM instrument available from Sonix, Inc. of Springfield, Va.

The embodiments and examples set forth herein were presented to explain the nature of the present invention and its practical application, and thereby to enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. For example, while the use of GaN LED chips is described herein, the invention contemplated is not so limited. One skilled in the art will recognize that the invention may potentially be applied to a variety of bond medium materials in many different types of devices or applications, and that various fabrication technologies may be used.

I claim:

1. A method of wafer-level bonding for fabricating an electronic device, comprising:

forming at least one layer of a first bond medium on a first surface of a first wafer, the first wafer comprising a first material and having a first coefficient of thermal expansion (CTE) and a total thickness variation (TTV) of 1 to 7 microns, the first wafer comprising at least one substrate and a plurality of light-emitting diode (LED) devices, in which the plurality of LED devices are accessible from the first surface;

forming at least one layer of a second bond medium on a second surface of a second wafer, the second wafer comprising a second material dissimilar from said first material and having a second CTE with a thermal mismatch from said first CTE and a TTV of 1 to 7 microns, the second surface comprising a plurality of LED bond areas, wherein the first bond medium and the second bond medium each comprises an electrically conductive material such as at least one metal, a total thickness of the first layer and the second layer being approximately 10 microns or greater, in which the first bond medium and the second bond medium each reduces stress created by said mismatch between said first and second CTEs, wherein the thickness of the first bond medium is different than the thickness of the second bond medium by at least one micron;

aligning the plurality of LED devices with the plurality of LED bond areas such that the first bond medium physically contacts the second bond medium; and wafer bonding the first wafer to the second wafer by bonding the first bond medium to the second bond medium, in which the first bond medium and the second bond medium adjust for thickness variations in the first wafer and the second wafer to reduce voids in said bond medium.

2. The method of claim 1, wherein the first wafer is a device wafer comprising at least one substrate.

3. The method of claim 2, wherein the first wafer further comprises an epitaxial layer on the at least one substrate.

4. The method of claim 1, wherein the second wafer is a submount wafer.

5. The method of claim 1, wherein the first bond medium and the second bond medium comprise thermally conducting material.

6. The method of claim 1, wherein the total thickness of the bond medium is 50-100 microns.

7. The method of claim 1, wherein the first bond medium is further deposited on the second surface.

8. The method of claim 1, wherein the at least one metal is selected from the group consisting of In, PdIn, PbSn, AgSn, AuSi, AuSn, and mixtures thereof.

9. The method of claim 1, wherein at least one of the first wafer and the second wafer comprises a material selected from the group consisting of sapphire, GaAs, GaP, AlN, GaN, Si, SiC, and mixtures thereof.

10. A method of fabricating an electronic device using wafer level bonding, comprising:

providing a first wafer having a first surface, the first wafer comprising a first material, at least one substrate, and a plurality of said electronic devices, in which the plurality of the electronic devices are accessible from the first surface, the first wafer having a first coefficient of thermal expansion (CTE) and a total thickness variation (TTV) of 1 to 7 microns;

providing a second wafer having a second surface, said second surface comprising a second material dissimilar from said first material and a plurality of device bond areas, the second wafer having a second CTE with a thermal mismatch from said first CTE and a TTV of 1 to 7 microns;

forming a first bond medium preform on said first surface of said first wafer and a second bond medium preform on said second surface of said second wafer, said first and second bond medium preforms comprising an electrically conducting material such as at least one metal, a total thickness of the first and second bond medium preforms being approximately 10 microns or greater, the thickness of the first bond medium preform differing from the thickness of the second bond medium preform by at least one micron;

positioning the first wafer on said second wafer such that said first bond medium preform physically contacts said second bond medium preform; and thinning the at least one substrate of the first wafer to a thickness of about the total thickness of the first and second bond medium preforms;

wherein the first and second bond medium preforms reduce effects of said CTE mismatch and adjust for thickness variations in the first wafer and the second wafer during wafer bonding.

11. The method of claim 10, wherein the total thickness of the first and second bond medium preforms is about 20 microns or less.

12. The method of claim 10, wherein the total thickness of the first and second bond medium preforms is 50-100 microns.

13. The method of claim 12, wherein the first wafer further comprises an epitaxial layer on the at least one substrate.

14. The method of claim 10, wherein the second wafer comprises a submount wafer.

15. The method of claim 2, further comprising removing the at least one substrate from the device wafer, wherein the at least one substrate is removed after wafer bonding.

* * * * *